US008537349B2

(12) United States Patent
Huet et al.

(10) Patent No.: US 8,537,349 B2
(45) Date of Patent: Sep. 17, 2013

(54) MONITORING OF TIME-VARYING DEFECT CLASSIFICATION PERFORMANCE (75) Inventors: Patrick Huet, San Jose, CA (US); Brian Duffy, San Jose, CA (US); Martin Plihal, Pleasanton, CA (US); Thomas Trautzsch, Jena (DE); Chris Maher, Campbell, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 12/811,319

(22) PCT Filed: Jun. 23, 2010

(86) PCT No.: PCT/US2010/039656
§ 371 (c)(1),
(2), (4) Date: May 16, 2011

(87) PCT Pub. No.: WO2011/002651
PCT Pub. Date: Jan. 6, 2011

(65) Prior Publication Data
US 2011/0224932 A1 Sep. 15, 2011

Related U.S. Application Data (60) Provisional application No. 61/222,388, filed on Jul. 1, 2009.

(51) Int. Cl.
*G01N 21/00* (2006.01)
(52) U.S. Cl.
USPC .................. 356/237.2; 356/237.6; 702/81
(58) Field of Classification Search
USPC .................. 356/237.2–237.6, 365; 703/81
See application file for complete search history.

(56) References Cited

U.S. PATENT DOCUMENTS

| 5,539,752 | A | 7/1996 | Berezin et al. | |
|---|---|---|---|---|
| 6,104,835 | A | 8/2000 | Han | |
| 6,408,219 | B2 | 6/2002 | Lamey, Jr. et al. | |
| 6,473,665 | B2 | 10/2002 | Mugibayashi et al. | |
| 6,890,775 | B2 | 5/2005 | Simmons | |
| 7,016,815 | B2 | 3/2006 | Dempsey et al. | |
| 7,345,753 | B2 * | 3/2008 | Bhaskar et al. | 356/237.5 |
| 7,359,544 | B2 | 4/2008 | Gao et al. | |
| 7,401,004 | B2 * | 7/2008 | Sato | 702/185 |
| 7,554,656 | B2 * | 6/2009 | Shortt et al. | 356/237.5 |
| 7,756,320 | B2 * | 7/2010 | Honda et al. | 382/149 |
| 2004/0234120 | A1 * | 11/2004 | Honda et al. | 382/145 |
| 2007/0115461 | A1 * | 5/2007 | Fairley et al. | 356/237.2 |
| 2007/0288219 | A1 | 12/2007 | Zafar et al. | |
| 2008/0032429 | A1 | 2/2008 | Chen et al. | |
| 2008/0129988 | A1 * | 6/2008 | Saito et al. | 356/237.2 |

\* cited by examiner

*Primary Examiner* — Tarifur Chowdhury
*Assistant Examiner* — Isiaka Akanbi
(74) *Attorney, Agent, or Firm* — Suiter Swantz pc llo (57) ABSTRACT

Systems and methods for monitoring time-varying classification performance are disclosed. A method may include, but is not limited to: receiving one or more signals indicative of one or more properties of one or more samples from one or more scanning inspection tools; determining populations of one or more defect types for the one or more samples according an application of one or more classification rules to the one or more signals received from the one or more scanning inspection tools; determining populations of the one or more defect types for the one or more samples using one or more high-resolution inspection tools; and computing one or more correlations between populations of one or more defect types for one or more samples determined from application of one or more classification rules applied to one or more signals received from the one or more scanning inspection tools and populations of the one or more defect types for the one or more samples determined using the one or more high-resolution inspection tools.

17 Claims, 9 Drawing Sheets

1010 receiving one or more signals indicative of one or more optical properties of one or more samples from one or more optical inspection tools 1020 determining populations of one or more defect types for the one or more samples according an application of one or more classification rules to the one or more signals received from the one or more optical inspection tools 1030 determining populations of the one or more defect types for the one or more samples using a high-resolution inspection tool 1040 computing one or more correlations between populations of one or more defect types for one or more samples determined from application of one or more classification rules applied to one or more signals received from the one or more optical inspection tools and populations of the one or more defect types for the one or more samples determined using the one or more high-resolution inspection tools

FIG. 10

1010 receiving one or more signals indicative of one or more optical properties of one or more samples from one or more optical inspection tools 1020 determining populations of one or more defect types for the one or more samples according an application of one or more classification rules to the one or more signals received from the one or more optical inspection tools > 1102 determining populations of one or more defect types for at least a first sample and a second sample according an application of one or more classification rules to the one or more signals received from the one or more optical inspection tools 1030 determining populations of the one or more defect types for the one or more samples using a high-resolution inspection tool > 1104 determining populations of one or more defect types for at least the first sample and the second sample using the high-resolution inspection tool 1040 computing one or more correlations between populations of one or more defect types for one or more samples determined from application of one or more classification rules applied to one or more signals received from the one or more optical inspection tools and populations of the one or more defect types for the one or more samples determined using the one or more high-resolution inspection tools > 1106 computing a relative stability between at least the first sample and the second sample of populations of one or more defect types determined from application of one or more classification rules to one or more signals received from the optical inspection tool and populations of one or more defect types as determined through use of the high-resolution inspection tool

FIG. 11

1010 receiving one or more signals indicative of one or more optical properties of one or more samples from one or more optical inspection tools 1020 determining populations of one or more defect types for the one or more samples according an application of one or more classification rules to the one or more signals received from the one or more optical inspection tools > 1202 determining a population of at least a first defect type and a second defect type for a sample according an application of one or more classification rules to the one or more signals received from the one or more optical inspection tools 1030 determining populations of the one or more defect types for the one or more samples using a high-resolution inspection tool > 1204 determining a population of at least a first defect type and a second defect type for a sample according using the high-resolution inspection tool 1040 computing one or more correlations between populations of one or more defect types for one or more samples determined from application of one or more classification rules applied to one or more signals received from the one or more optical inspection tools and populations of the one or more defect types for the one or more samples determined using the one or more high-resolution inspection tools > 1206 computing a first correlation between the population of the first defect type and the population of the second defect type as determined from application of one or more classification rules to one or more signals associated with the sample received from the optical inspection tool > 1208 computing a second correlation between the population of the first defect type and the population of the second defect type as determined using the high-resolution inspection tool > 1210 computing a correlation between the first correlation and the second correlation

FIG. 12

1010 receiving one or more signals indicative of one or more optical properties of one or more samples from one or more optical inspection tools 1020 determining populations of one or more defect types for the one or more samples according an application of one or more classification rules to the one or more signals received from the one or more optical inspection tools 1030 determining populations of the one or more defect types for the one or more samples using a high-resolution inspection tool 1040 computing one or more correlations between populations of one or more defect types for one or more samples determined from application of one or more classification rules applied to one or more signals received from the one or more optical inspection tools and populations of the one or more defect types for the one or more samples determined using the one or more high-resolution inspection tools 1302 generating one or more classification rules to be applied to one or more signals received from an optical inspection tool

FIG. 13

1010 receiving one or more signals indicative of one or more optical properties of one or more samples from one or more optical inspection tools

1020 determining populations of one or more defect types for the one or more samples according an application of one or more classification rules to the one or more signals received from the one or more optical inspection tools

1030 determining populations of the one or more defect types for the one or more samples using a high-resolution inspection tool

1040 computing one or more correlations between populations of one or more defect types for one or more samples determined from application of one or more classification rules applied to one or more signals received from the one or more optical inspection tools and populations of the one or more defect types for the one or more samples determined using the one or more high-resolution inspection tools

1402 modifying one or more classification rules according to the one or more correlations between the populations of one or more defect types for the one or more samples determined from application of one or more classification rules to one or more signals received from the optical inspection tool and populations of defect types determined using the high-resolution inspection tool

FIG. 14

MONITORING OF TIME-VARYING DEFECT CLASSIFICATION PERFORMANCE

CROSS-REFERENCE TO RELATED APPLICATION

This application claims priority from PCT Application Ser. No. PCT/US10/39656 filed on Jun. 23, 2010, which claims priority to U.S. Provisional Application Ser. No. 61/222,388 filed on Jul. 1, 2009. PCT Application No. PCT/US10/39656 and U.S. Provisional Application No. 61/222,388 are hereby incorporated by reference in their entirety.

BACKGROUND

In semiconductor device fabrication, defect classification for patterned and unpatterned wafer inspection is the process of parsing scanning inspector defect data based on various defect related parameters including attributes extracted from data acquired during the defect detection process (e.g. patch images, image feature vectors, sensor data streams, and the like) and context attributes derived from external sources (during or after the detection process) such as chip layout. (See, e.g. U.S. Pat. No. 7,676,077 to Kulkarni, et al.; U.S. Pat. No. 7,570,796 to Zaffar, et al.). Such functionality may be carried out by defect classifier modules associated with various scanning defect inspection tools (e.g. bright field patterned wafer inspectors, patterned or unpatterned dark field photon optics wafer inspectors; electron beam optics area scanning inspectors, and the like). Current classifier maintenance methodologies may not measure and leverage historical information and time-dependency trends in classifier performance. Typically, ad hoc snapshots of a classifier's performance may be observed and, where performance is degraded, a need for a change in the classifier may be inferred. Production data is then collected and used to update the classifier.

Current methodologies relying on degraded classifier performance to trigger scrutiny of that performance fails to leverage all information regarding classifier performance as a function of time. As a result, such methodologies do not provide any means of quantifying the changes in behavior of the classifier relative to a baseline. In particular, it does not provide any way to quantify or even to identify whether the classifier performance change is due to instability against process fluctuations reflected in defect properties or is the result of a change in relative populations between defect types. Instead current classifier maintenance methodologies use ad hoc qualitative information rather than cumulated statistical information collected over past production runs.

Such ad hoc metrics lack the ability to quantify the variations in classification performance occurring or predicted to occur from one production wafer to another. Further, such ad hoc metrics do not take into considerations inspector tool hardware and inspector sensitivity considerations. The consequence of these shortcomings is that both under-correction and over-correction can occur in the classification maintenance business process which can put the fab at risk for misreading the significance of defect inspection data.

SUMMARY

Systems and methods for monitoring time-varying classification performance are disclosed.

A method may include, but is not limited to: receiving one or more signals indicative of one or more properties of one or more samples from one or more scanning inspection tools; determining populations of one or more defect types for the one or more samples according an application of one or more classification rules to the one or more signals received from the one or more scanning inspection tools; determining populations of the one or more defect types for the one or more samples using one or more high-resolution inspection tools; and computing one or more correlations between populations of one or more defect types for one or more samples determined from application of one or more classification rules applied to one or more signals received from the one or more scanning inspection tools and populations of the one or more defect types for the one or more samples determined using the one or more high-resolution inspection tools.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which Figure Number.

DETAILED DESCRIPTION OF THE INVENTION

In the following detailed description of exemplary embodiments, reference is made to the accompanying drawings, which form a part hereof. In the several figures, like referenced numerals identify like elements. The detailed description and the drawings illustrate exemplary embodiments. Other embodiments may be utilized, and other changes may be made, without departing from the spirit or scope of the subject matter presented here. The following detailed description is therefore not to be taken in a limiting sense, and the scope of the claimed subject matter is defined by the appended claims.

Figure 1:
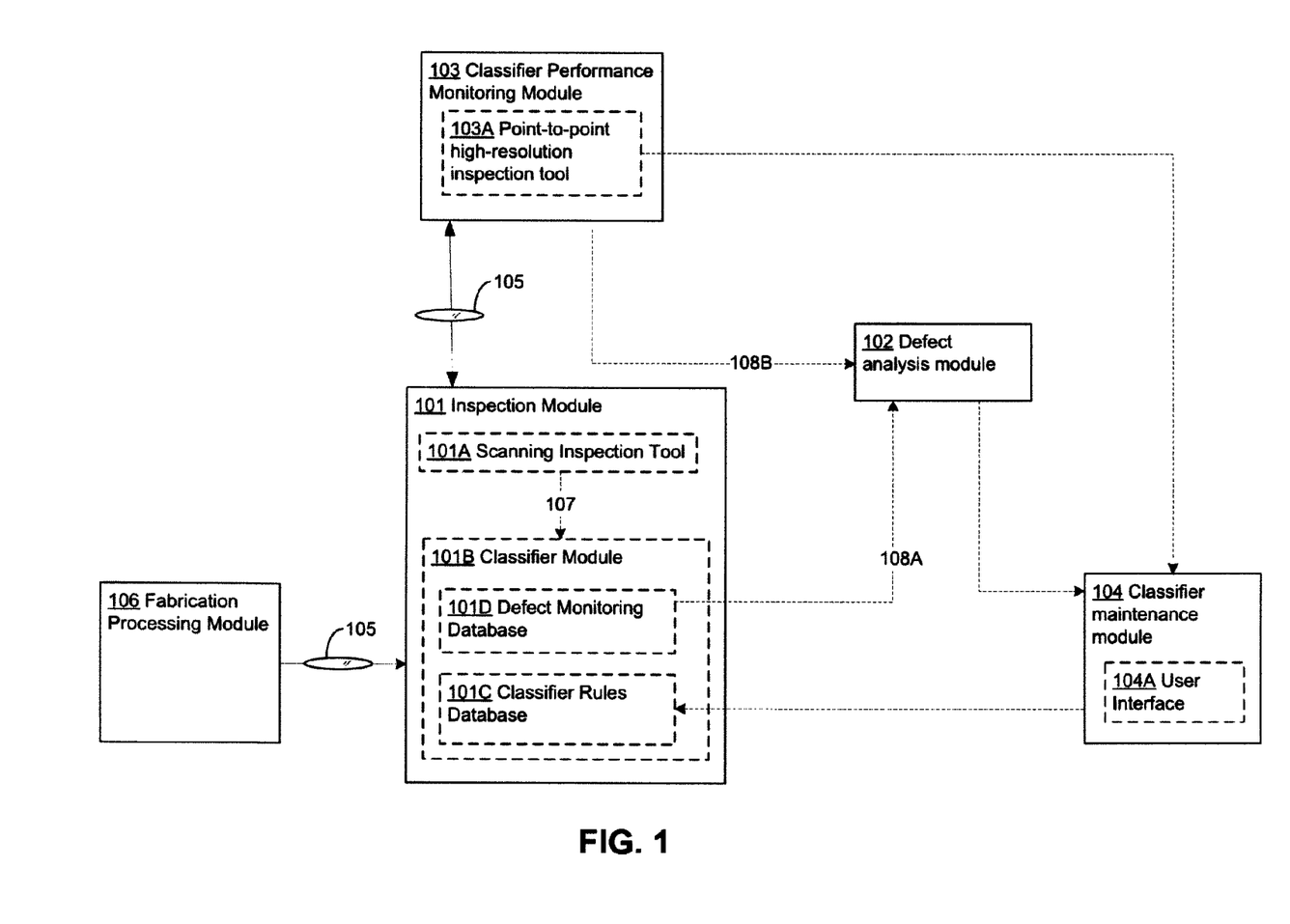
FIG. 1 shows a system for monitoring time-varying classification performance.

Referring to FIG. 1, a system 100 for monitoring time-varying classification performance is shown. The system 100 may include an inspection module 101, a defect analysis module 102, a classifier performance monitoring module 103 and a classifier maintenance module 104.

An inspection module 101 may include a scanning inspection tool 101A. The scanning inspection tool 101A may include any number of patterned wafer defect detection tool types (e.g. bright field UV/DUV inspectors, dark field laser scattering inspectors, electron beam inspectors, and the like) configured to scan an area of a wafer sample. In addition, the principles of this invention may be applicable to bare wafer inspection and review processes. The scanning inspection tool 101A may be configured to detect manufacturing defects (e.g. particles, pattern defects, scratches, film imperfections, and the like) in semiconductor components created during a semiconductor fabrication process. In order to optimize the fabrication process, it may be desirable to know the types and populations of various defect types as determined by the inspection module 101. As such, the inspection module 101 may include a classifier module 101B.

For example, as shown in FIG. 1, the classifier module 101B may include a classifier rules database 101C. The classifier rules database 101C may include properties (e.g. size, shape, polarity, texture, contrast, background business, and the like) defining various defect types for comparison with data generated by the scanning inspection tool 101A so as to enable the classifier module 101B to associate a particular optical signature with a defined defect type. The defect type definitions of the classifier rules database 101C may be generated from analysis of scanning inspection tool 101A data associated with known defects.

For example, one or more reference wafers having one or more defect types may be analyzed using a point-to-point (e.g. rastered pattern) inspection using a high-resolution inspection tool 103A configured to examine a wafer sample. The high-resolution inspection tool 103A may be a scanning electron microscope optimized for the defect classification use case. Alternative image acquisition technologies may include atomic force microscopes, confocal UV/DUV, EUV microscopes, and the like. The defect types may be analyzed by a technician may examine images of the reference wafer generated with a scanning electron microscope) of the performance monitoring module 103 to determine the various defects present in the reference wafer. Point-to-point high resolution image acquisition tools may be augmented with materials analysis instruments that can add additional attributes to the classification process.

Upon analysis of the reference wafers using the high-resolution inspection tool 103A, a reference population distribution for the various defect types on each reference wafer may be determined. The reference population distribution may be provided to the classifier maintenance module 104.

An inspection of the one or more reference wafers may then be conducted by the inspection module 101 using a given set of defect type definitions stored in classifier rules database 101C. The inspection data generated by the scanning inspection tool 101A may be received by the classifier module 101B. The classifier module 101B may cross-reference the inspection data generated by the scanning inspection tool 101A with the defect type definitions maintained in the classifier rules database 101C in order to determine the presence of one or more defects as defined by those defect type definitions. The classifier module 101B may generate a resulting sample defect distribution corresponding to the respective populations of the defect types detected on the one or more reference wafers. The sample population distribution may be provided to the classifier maintenance module 104.

The reference population distribution received from performance monitoring module 103 and the sample population distribution received by the classifier maintenance module 104 may be compared to determine the correlation between the respective distributions.

If it is determined that current defect type definitions maintained by the classifier rules database 101C result in a sample defect distribution that does not correspond to (i.e. is outside a tolerance range) the reference population distribution, the classifier maintenance module 104 may be used to modify those defect type definitions (e.g. via manual intervention by an expert or through various levels of automation based on configurable rules) and an inspection using the inspection module 101 repeated until the sample defect distribution that corresponds to (i.e. is within a tolerance range) the reference population distribution established using the high-resolution inspection tool 103A. If it is determined that the current defect type definitions maintained by the classifier rules database 101C result in a sample defect distribution that corresponds to (i.e. is within a tolerance range) the reference population distribution established using the high-resolution inspection tool 103A, those defect type definitions may be approved for use in inspection operations for wafer fabrication runs.

Once the classifier module 101B containing the approved defect type definitions in its classifier rules database 101C is incorporated into a production environment, it may be desirable to extract quantitative classification performance data generated by the classifier module 101B and analyze that data in order to validate the adequacy of the response by the classifier module 101B to variations in one or more of the fabrication process, the inspection module 101 and the classifier module 101B itself. This classification performance information can subsequently be used to guide corrective actions to restore degraded classifier performance to fit the current production environment.

The system 100 may be employed to execute one or more computing device-based methods to measure statistical metrics associated with the classifier module 101B to capture time-dependent classification results obtained using the inspection module 101 across inspected wafers and to compare those results to time-dependent classifications of defect populations associated with defect types estimated from a sample defect pareto (e.g. as produced from analysis of SEM images). The comparison methods may produce statistical metrics designed to measure how the classification results are indicative of the true population and to indicate any departure from an established baseline.

The proposed method may address and help identify the two inherent sources of classifier performance variations: 1) Response to wafer-to-wafer variations in defect properties within each defect type typically referred to as "classifier stability;" and 2) Response to wafer-to-wafer variations in the relative defect type populations.

The instability due to wafer-to-wafer variations in defect properties is a result of the fact that classifiers classify defects based on certain defect properties (attributes) and/or features, which may correlate only partially with true defect types. The natural or process-variation-induced fluctuations of properties within a defect type population lead to certain probability of misclassification. Examples of wafer properties that can impact the attributes that feed the classification module include film thickness variation (local/high spatial frequency or global/low spatial frequency), lateral dimension variability, film reflectivity variability, index of refraction variability, and/or layer to layer alignment variability.

The instability due to wafer-to-wafer variations in the relative defect type populations may also affect the classifier performance due to a classifier's imperfect accuracy and purity.

Statistical metrics may allow for the identification of short-term and long-term trends in classifier performance that constitute signals of process variations and inspector calibration drifts that otherwise would remain undetected. The pattern and time-occurrence of these trends in time may help to pinpoint a root cause and/or trigger one or more corrective actions (e.g. correction of a fabrication process change, scanning inspection tool 101A maintenance or classifier module 101B maintenance).

The statistical metrics may indicate whether it is the classifier stability or the classifier purity that may be optimized, hence, providing guidelines for how to proceed with the subsequent optimization step.

Following is a description of a series of flowcharts depicting implementations. For ease of understanding, the flowcharts are organized such that the initial flowcharts present implementations via an example implementation and thereafter the following flowcharts present alternate implementations and/or expansions of the initial flowchart(s) as either sub-component operations or additional component operations building on one or more earlier-presented flowcharts. Those having skill in the art will appreciate that the style of presentation utilized herein (e.g., beginning with a presentation of a flowchart(s) presenting an example implementation and thereafter providing additions to and/or further details in subsequent flowcharts) generally allows for a rapid and easy understanding of the various process implementations. In addition, those skilled in the art will further appreciate that the style of presentation used herein also lends itself well to modular and/or object-oriented program design paradigms.

FIGS. 10-14 illustrate an operational flow representing example operations related to monitoring classifier performance. In FIGS. 10-14 that include various examples of operational flows, discussion and explanation may be provided with respect to the above-described examples of FIG. 1, and/or with respect to other examples and contexts. However, it should be understood that the operational flows may be executed in a number of other environments and contexts, and/or in modified versions of FIGS. 10-14. In addition, although the various operational flows are presented in the sequence(s) illustrated, it should be understood that the various operations may be performed in other orders than those that are illustrated, or may be performed concurrently.

Figure 10:
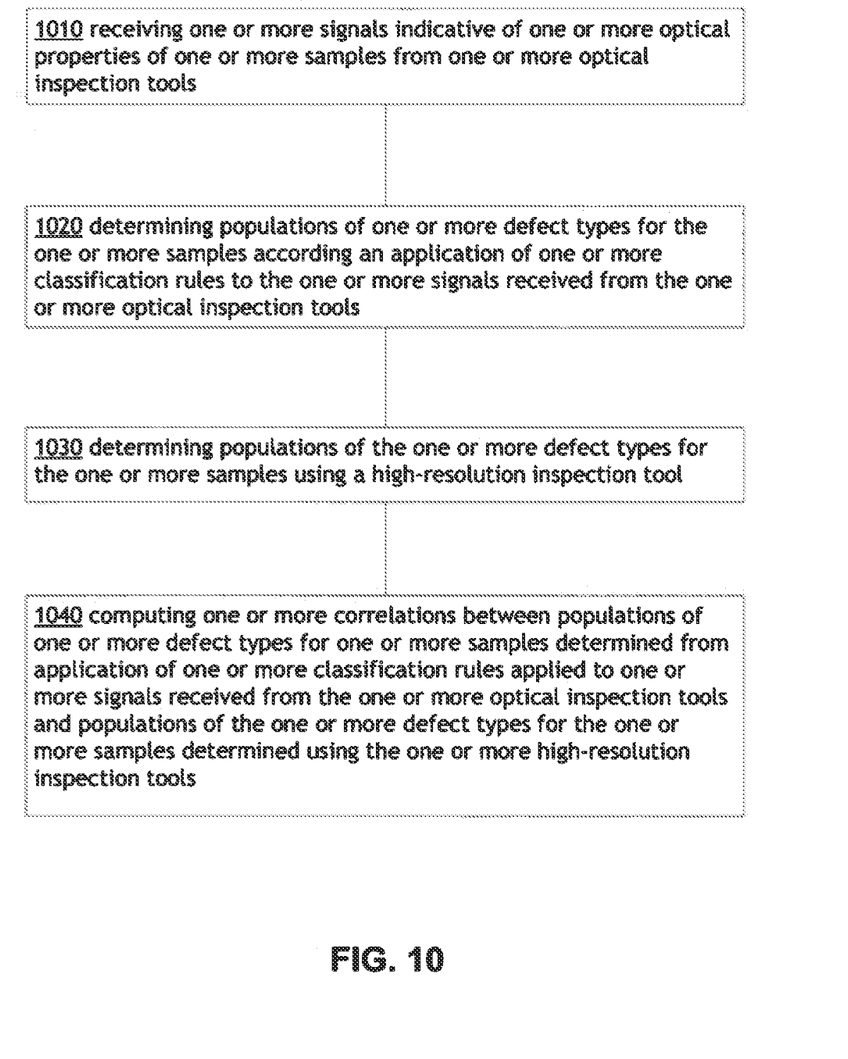
FIG. 10 shows a method for monitoring time-varying classification performance.

Referring to FIG. 10, an operational flow diagram for a process 1000 is shown. Operation 1010 depicts receiving one or more signals indicative of one or more properties of one or more samples from one or more scanning inspection tools. For example, as shown in FIG. 1, a sample wafer 105 including one or more semi-conductor structures may be created during a production run of a fabrication processing module 106. The sample wafer 105 may be received by the scanning inspection tool 101A of the inspection module 101 where the scanning inspection tool 101A may generate signals 107 indicative of the optical characteristics of the sample wafer 105 that may include signals indicative of one or more defects, thereby providing an indication of a detection of those defects.

Operation 1020 depicts determining populations of one or more defect types for the one or more samples according an application of one or more classification rules to the one or more signals received from the one or more scanning inspection tools. For example, as shown in FIG. 1, the classifier module 101B may receive the signals 107 indicative of the optical characteristics of the sample wafer 105 from the scanning inspection tool 101A. The classifier module 101B may apply one or more classification rules maintained in the classifier rules database 101C to the signals 107 to determine if the signals 107 indicate the presence of a particular type of defect. If a defect of a particular type is determined to be present on the sample wafer 105 based on the analysis of the signals 107, the classifier module 101B may update a defect monitoring database 101D (e.g. increasing a counter associated with the defect type).

Operation 1030 depicts determining populations of the one or more defect types for the one or more samples using one or more high-resolution inspection tools. For example, as shown in FIG. 1, the same sample wafer 105 provided to the scanning inspection tool 101A may also be provided to the performance monitoring module 103. At the performance monitoring module 103 the sample wafer 105 may be analyzed by a high-resolution inspection tool 103A (e.g. an SEM). The point-to-point high-resolution inspection tool 103A may offer imaging performance improvements over the scanning inspection tool 101A but may not be suited for in-line large area defect detection during wafer fabrication runs. However, it may be employed as a tool for verification of the performance of the scanning inspection tool 101A on a periodic, sub-sampled basis. In order to determine the population for defects of the particular type previously determined using the scanning inspection tool 101A, a technician may examine images of the reference wafer generated with the high-resolution inspection tool 103A to manually determine the population. Alternately, automated image processing tools may be employed to examine the images to determine the population.

Figure 2:
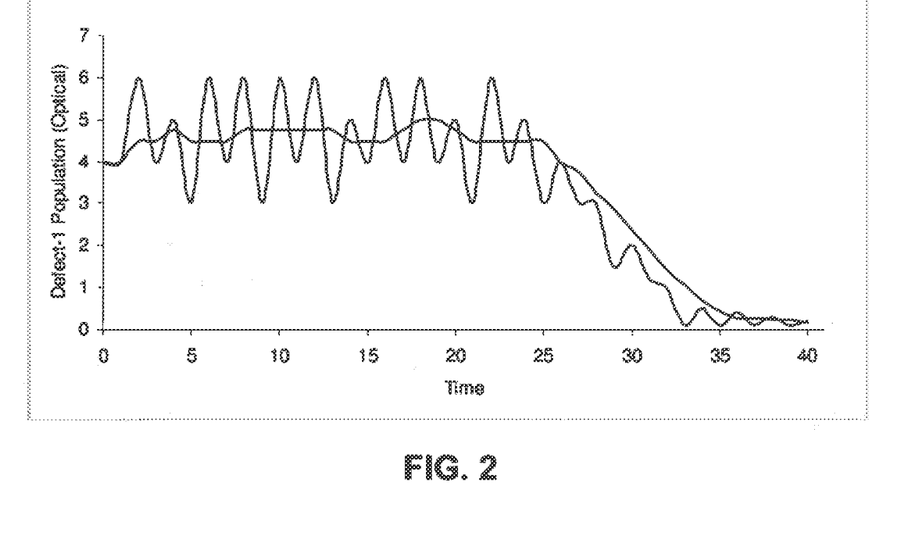
FIG. 2 shows a graphical representation of defect populations.
Figure 3:
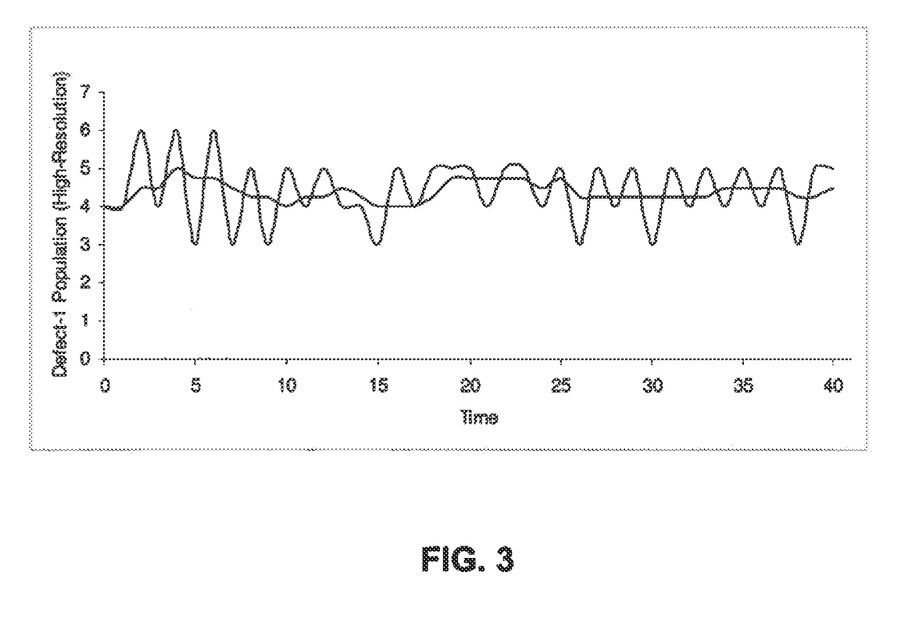
FIG. 3 shows a graphical representation of defect populations.

Operation 1040 depicts computing one or more correlations between populations of one or more defect types for one or more samples determined from application of one or more classification rules applied to one or more signals received from the one or more scanning inspection tools and populations of the one or more defect types for the one or more samples determined using the one or more high-resolution inspection tools. For example, as shown in FIG. 1, the defect analysis module 102 may receive defect population data 108 as determined by the inspection module 101 (e.g. defect population data 108A) and defect population data 108 as determined by the performance monitoring module 103 (e.g. defect population data 108B) from those respective modules. The defect population data 108 data may be received over a period of time such that the time dependency of the defect population data 108 may be monitored by the defect analysis module 102. For example, as shown in FIGS. 2 and 3, various defect populations represented by the defect population data 108A and defect population data 108B may be plotted against one another and one or more correlations may be determined from those data sets. For example, particular correlations that may determined include: 1) the relative stability of a defect population as determined by the inspection module 101 as compared to stability of a defect population as determined by the performance monitoring module 103; or 2) the ongoing performance characteristics of the inspection module 101 as compared to the performance monitoring module 103.

For example, a trend line indicative of a moving average for each of the defect population data 108A and defect population data 108B is shown in FIGS. 2 and 3, respectively. As can be seen, from approximately t=4 to approximately t=20, there is a high degree of correlation between the defect population data 108A of FIG. 2 and the defect population data 108B of FIG. 3 (e.g. there is little departure of the trend line of FIG. 2 from the trend line of FIG. 3). As such the defect population data 108A of FIG. 2 can be said to be relatively stable with respect to the defect population data 108A of FIG. 3. Such correlation may indicate that the classification rules of the classifier rules database 101C governing the classification of defects by the inspection module 101 may be adequate.

However, from approximately t=20 to t=40, there is a low degree of correlation between the defect population data 108A of FIG. 2 and the defect population data 108B of FIG. 3 (e.g. there is large departure of the trend line of FIG. 2 from the trend line of FIG. 3). Such deviations may indicate a problem with the inspection module 101 (as opposed to the fabrication processing module 106) as the classification rules of the classifier rules database 101C governing the classification of defects by the inspection module 101 may be inadequate to properly classify such defects.

Figure 11:
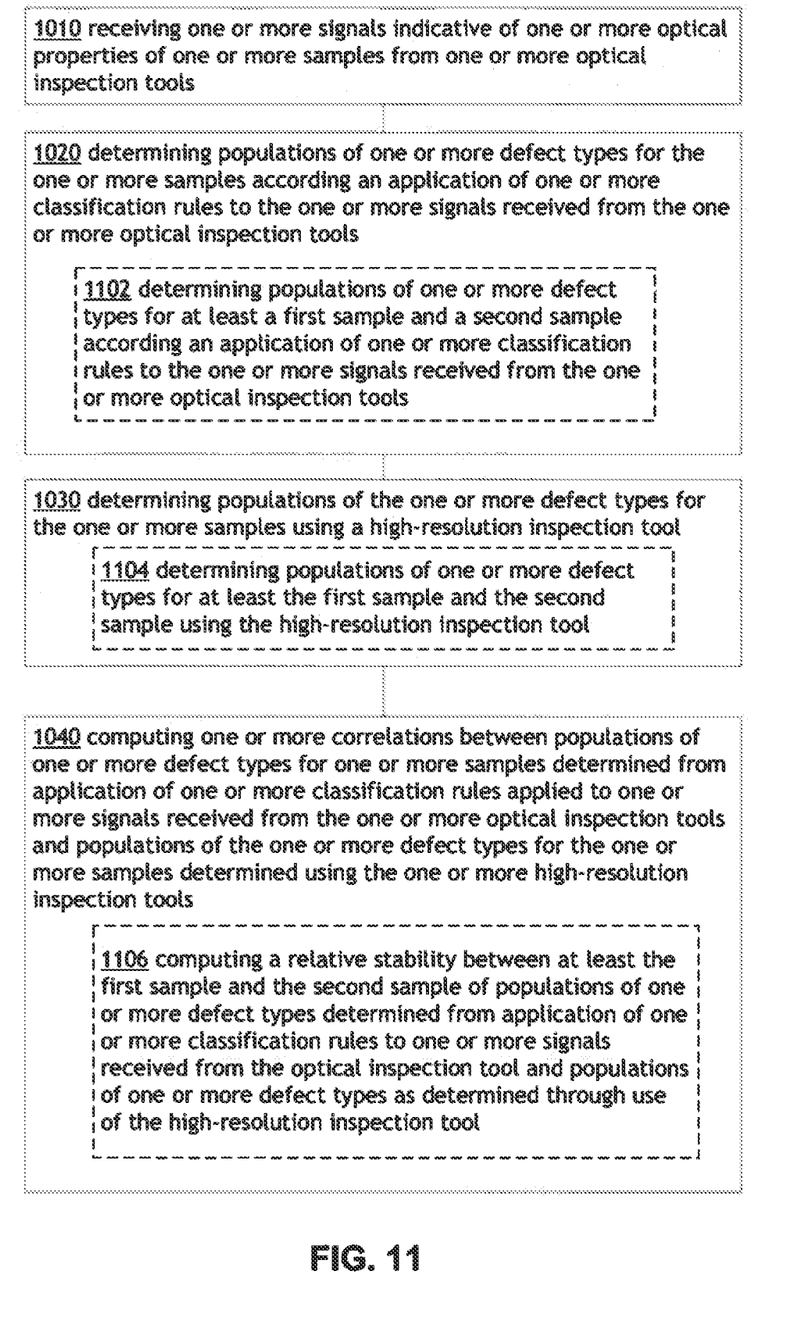
FIG. 11 shows a method for monitoring time-varying classification performance.

FIG. 11 illustrates alternative embodiments of the example operational flow 1000 of FIG. 10. FIG. 11 illustrates example embodiments where the operations 1020, 1030 and 1040 of operational flow 1000 may include at least one additional operation. Additional operations may include an operation 1102; and/or an operation 1104; and/or an operation 1106.

Operation 1102 depicts determining populations of one or more defect types for at least a first sample and a second sample according an application of one or more classification rules to the one or more signals received from the one or more scanning inspection tools. For example as shown in FIG. 1, the inspection module 101 may determine a population of a particular defect type (as described above with respect to operation 1020) on a first sample wafer 105. That population may be associated with a first point in time (e.g. the completion time of the fabrication of the first sample wafer 105). Similarly, the inspection module 101 may determine a population of the particular defect type (as described above with respect to operation 1020) on a second sample wafer 105. That population may be associated with a second point in time (e.g. the completion time of the fabrication of the second sample wafer 105). The inspection module 101 may then provide defect population data 108A regarding the first sample wafer 105 and the second sample wafer 105 to the defect analysis module 102.

Operation 1104 depicts determining populations of one or more defect types for at least the first sample and the second sample using the one or more high-resolution inspection tools. For example as shown in FIG. 1, the performance monitoring module 103 may determine a population of a particular defect type (as described above with respect to operation 1030) on the first sample wafer 105. That population may be associated with the first point in time (e.g. the completion time of the fabrication of the first sample wafer 105). Similarly, the performance monitoring module 103 may determine a population of the particular defect type (as described above with respect to operation 1030) on a second sample wafer 105. That population may be associated with the second point in time (e.g. the completion time of the fabrication of the second sample wafer 105). The performance monitoring module 103 may then provide defect population data 108B regarding the first sample wafer 105 and the second sample wafer 105 to the defect analysis module 102.

Operation 1106 depicts computing a relative stability between at least the first sample and the second sample of populations of one or more defect types determined from application of one or more classification rules to one or more signals received from the one or more optical inspection tools and populations of one or more defect types as determined through use of the one or more high-resolution inspection tools. For example, as shown in FIG. 1, the defect analysis module 102 may monitor the defect population data 108A over time. For example, as shown in FIG. 2, defect population data 108A indicating a defect population for a particular defect type (e.g. Defect-1) found in the first sample wafer 105 and the second sample wafer 105 may be plotted according to a time corresponding to the completion of the fabrication of first sample wafer 105 and the second sample wafer 105, respectively, thereby enabling the defect analysis module 102 to monitor the defect population data 108A over time.

Similarly, the defect analysis module 102 may monitor the defect population data 108B over time. For example, as shown in FIG. 3, defect population data 108B indicating a defect population for a particular defect type (e.g. Defect-1) found in the first sample wafer 105 and the second sample wafer 105 may be plotted according to a time corresponding to the completion of the fabrication of first sample wafer 105 and the second sample wafer 105, respectively, thereby enabling the defect analysis module 102 to monitor the defect population data 108B over time.

The defect analysis module 102 may then determine a correlation between the defect population data 108A and defect population data 108B over time. The correlation between the defect population data 108A and defect population data 108B may be the relative stabilities of that data.

Figure 4:
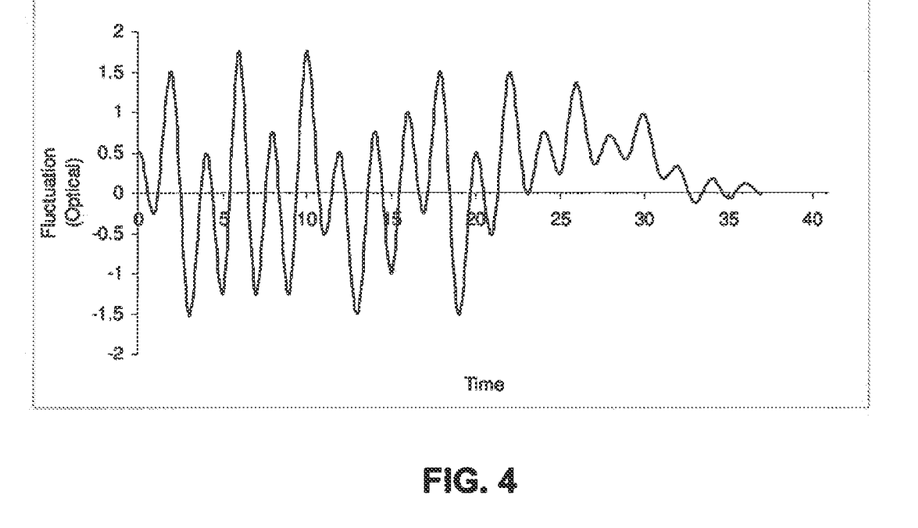
FIG. 4 shows a graphical representation of defect populations.
Figure 5:
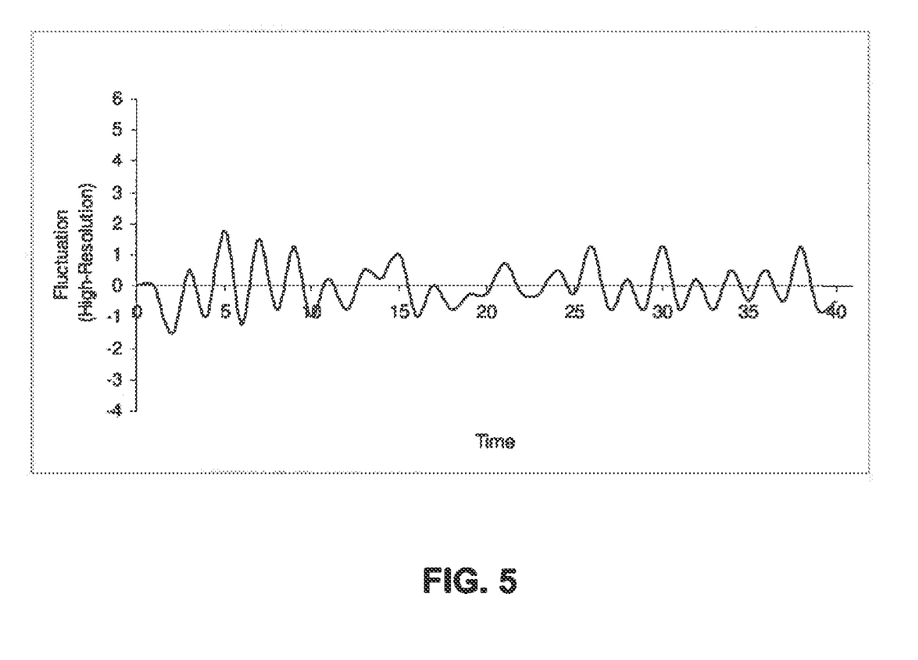
FIG. 5 shows a graphical representation of defect populations.

The relative stabilities of the defect population data 108A and the defect population data 108B may measured by the degree of fluctuation within those data sets. For example, FIG. 4 depicts the departures of the defect population data 108A from its moving average (as shown in FIG. 2). Similarly, FIG. 5 depicts the departures of the defect population data 108B from its moving average (as shown in FIG. 3). As can be seen, the degree of fluctuation for the defect population data 108A is greater than that of defect population data 108B for the period t=0 to t=20. Such instability may indicate that the classification rules of the classifier rules database 101C governing the classification of defects may be adequate.

Figure 12:
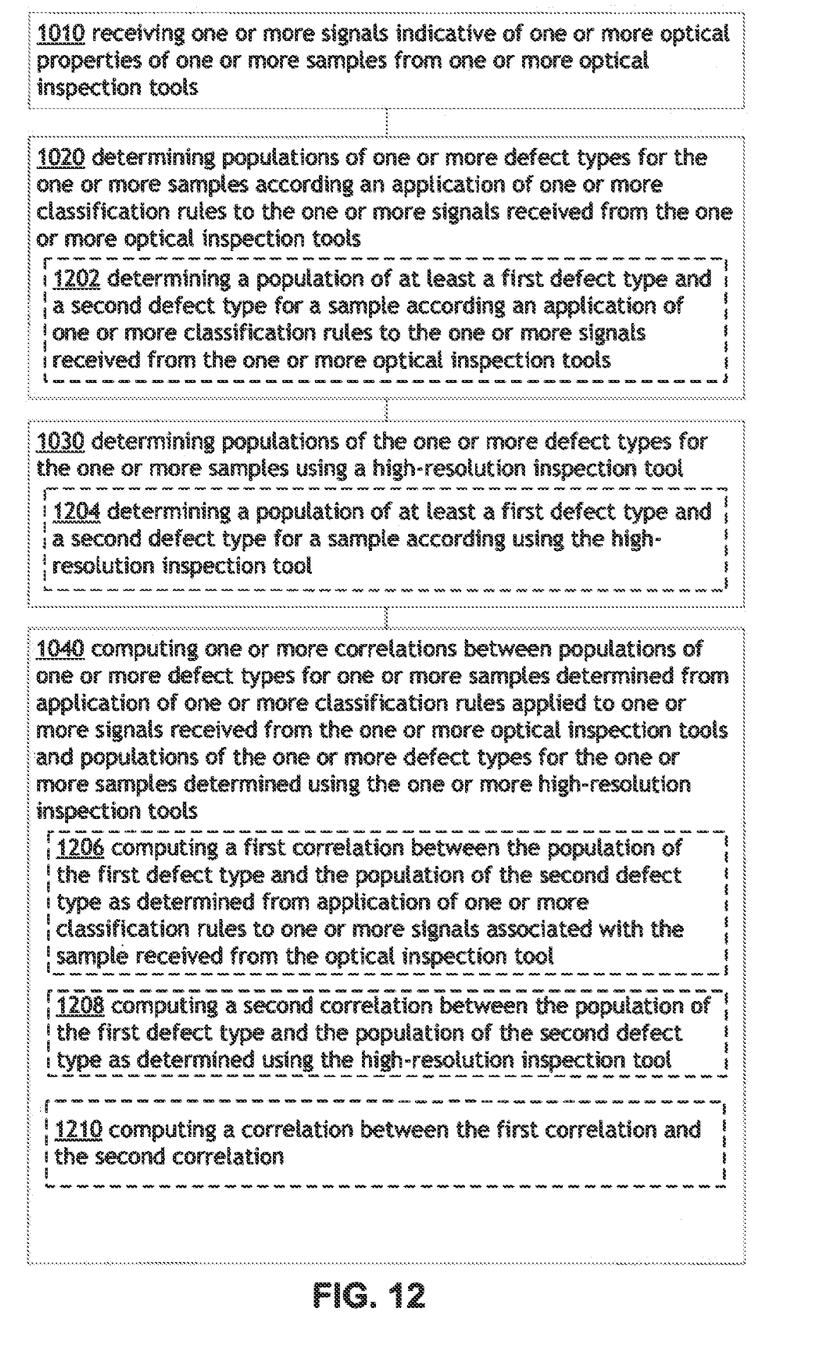
FIG. 12 shows a method for monitoring time-varying classification performance.

FIG. 12 illustrates alternative embodiments of the example operational flow 1000 of FIG. 10. FIG. 12 illustrates example embodiments where the operations 1020, 1030 and 1040 of operational flow 1000 may include at least one additional operation. Additional operations may include an operation 1202; and/or an operation 1204; and/or an operation 1206; and/or an operation 1208; and/or an operation 1210.

Operation 1202 depicts determining a population of at least a first defect type and a second defect type for a sample according an application of one or more classification rules to the one or more signals received from the one or more scanning inspection tools. For example as shown in FIG. 1, the inspection module 101 may determine a population of a first defect type (as described above with respect to operation 1020) on a sample wafer 105. Similarly, the inspection module 101 may determine a population of a particular second defect type (as described above with respect to operation 1020) on the sample wafer 105. The inspection module 101 may then provide defect population data 108A regarding the first sample wafer 105 and the second sample wafer 105 to the defect analysis module 102.

Operation 1204 depicts determining a population of at least a first defect type and a second defect type for a sample according using the one or more high-resolution inspection tools. For example as shown in FIG. 1, the performance monitoring module 103 may determine a population of a first defect type (as described above with respect to operation 1030) on the sample wafer 105. Similarly, the performance monitoring module 103 may determine a population of a second defect type (as described above with respect to operation 1030) on the sample wafer 105. The performance monitoring module 103 may then provide defect population data 108B regarding the first defect type and the second defect type found on the sample wafer 105 to the defect analysis module 102.

Figure 6:
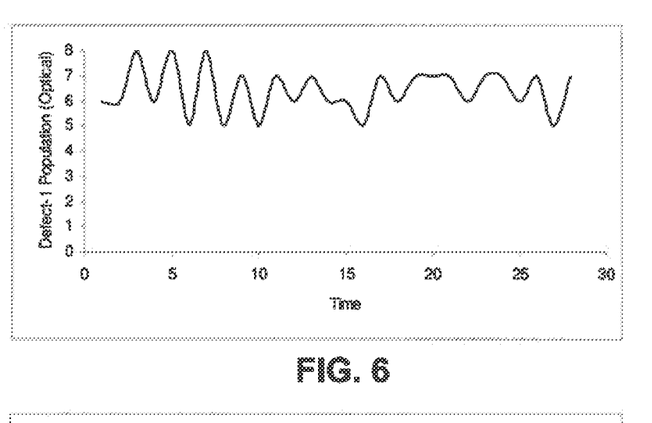
FIG. 6 shows a graphical representation of defect populations.
Figure 7:
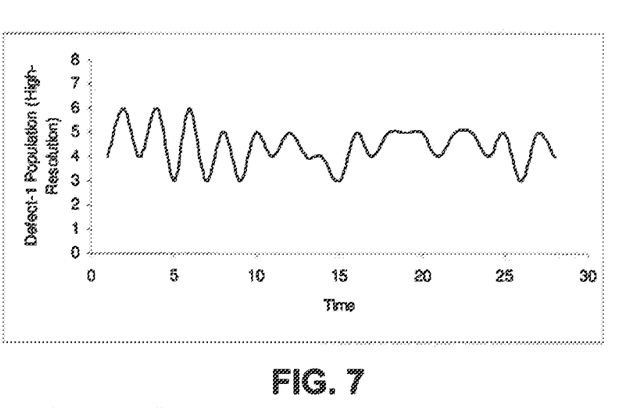
FIG. 7 shows a graphical representation of defect populations.

Operation 1206 depicts computing a first correlation between the population of the first defect type and the population of the second defect type as determined from application of one or more classification rules to one or more signals associated with the sample received from the one or more scanning inspection tools. For example, as shown in FIG. 1, the defect analysis module 102 may monitor the defect population data 108A. For example, as shown in FIGS. 6-7, defect population data 108A indicating a defect population for a first defect type (e.g. Defect-1) found in a sample wafer 105 and a defect population for a second defect type (e.g. Defect-2) found on the sample wafer 105 may be plotted according to a time corresponding to the completion of the fabrication of the sample wafer 105, thereby enabling monitoring of the defect population for the first defect type (e.g. Defect-1) the defect population for a first defect type (e.g. Defect-2). A correlation (e.g. a ratio) between the first defect type and the second defect type may be computed from the defect population data 108A.

Figure 8:
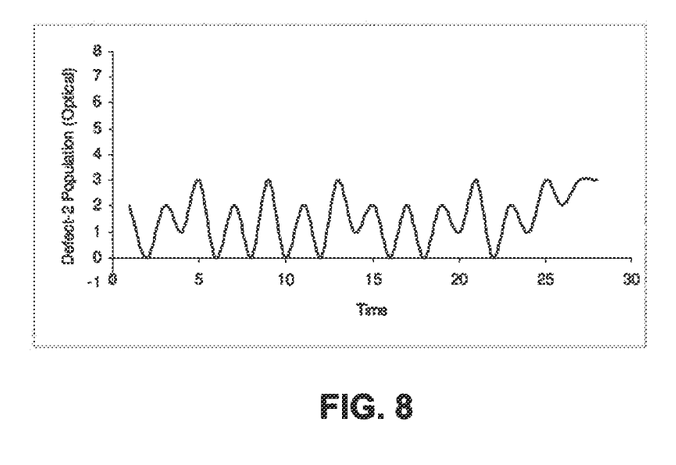
FIG. 8 shows a graphical representation of defect populations.
Figure 9:
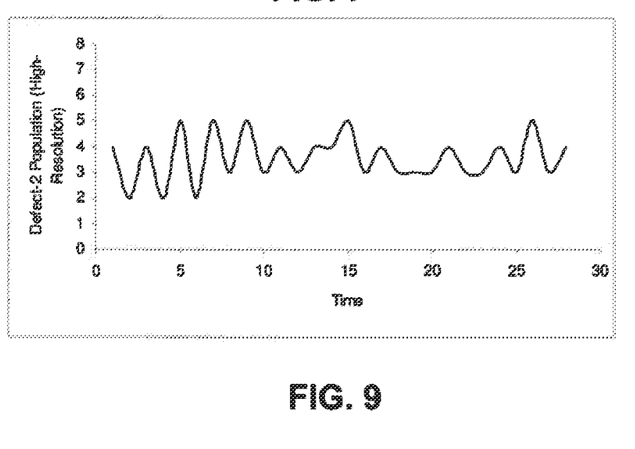
FIG. 9 shows a graphical representation of defect populations.

Operation 1208 depicts computing a second correlation between the population of the first defect type and the population of the second defect type as determined using the one or more high-resolution inspection tools. For example, as shown in FIG. 1, the defect analysis module 102 may monitor the defect population data 1086. For example, as shown in FIGS. 8-9, defect population data 108A indicating a defect population for a first defect type (e.g. Defect-1) found in the sample wafer 105 and a defect population for a second defect type (e.g. Defect-2) found in the sample wafer 105 may be plotted according to a time corresponding to the completion of the fabrication of the sample wafer 105, thereby enabling monitoring of the defect population for the first defect type (e.g. Defect-1) the defect population for a first defect type (e.g. Defect-2). A correlation (e.g. a ratio) between the first defect type and the second defect type may be computed from the defect population data 1086.

The defect analysis module 102 may then determine a correlation between the relative performances of the inspection module 101 and the performance monitoring module 103 in distinguishing between the first defect type and the second defect type.

Operation 1210 depicts computing a correlation between the first correlation and the second correlation. For example, the relative performance of the inspection module 101 and the performance monitoring module 103 may be measured by the degree of mixing between the first and second defect types within the defect population data 108A and the defect population data 1086, respectively.

For example, as described above, FIG. 6 depicts the population of a Defect-1 in a sample wafer 105 as determined by the inspection module 101. FIG. 7 depicts a population of a Defect-2 in the sample wafer 105 as determined by the inspection module 101. FIG. 8 depicts the population of the Defect-1 as determined by the inspection module 101. FIG. 9 depicts the population of the Defect-2 in the sample wafer 105 as determined by the performance monitoring module 103.

As can be seen in FIGS. 6-9, a correlation (e.g. a relationship between the ratio of Defect-1 to Defect-2 as determined by the inspection module 101 and the ratio of Defect-1 to Defect-2 as determined by the performance monitoring module 103) may be computed. The correlation may show that the ratio of Defect-1 to Defect-2 as determined by the inspection module 101 is generally higher than the ratio of Defect-1 to Defect-2 as determined by the performance monitoring module 103. Such a correlation may be indicative of mixing of some instances of Defect-2 into the population of Defect-1 by the inspection module 101. Such mixing may be indicative that the classification rules governing defect classification may be too sensitive to Defect-1 or not sensitive enough to Defect-2.

Figure 13:
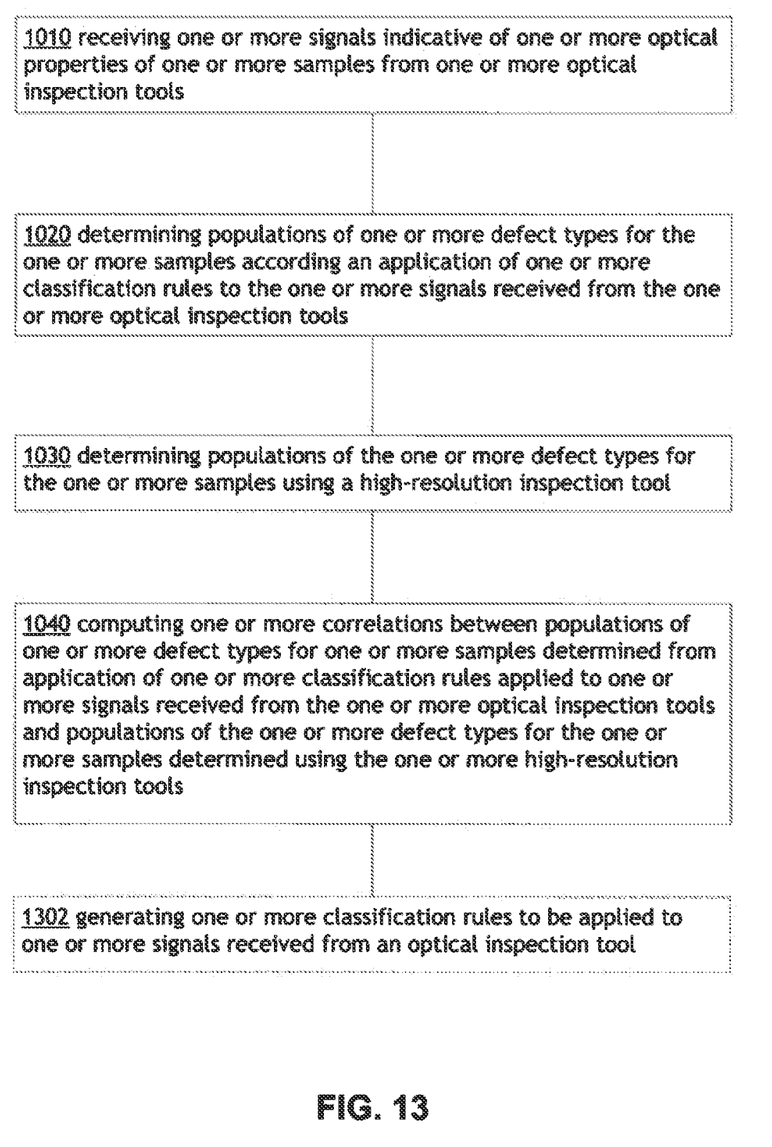
FIG. 13 shows a method for monitoring time-varying classification performance.

FIG. 13 illustrates alternative embodiments of the example operational flow 1000 of FIG. 10. FIG. 13 illustrates example embodiments where the operational flow 1000 may include at least one additional operation. Additional operations may include an operation 1302.

Operation 1302 depicts generating one or more classification rules to be applied to one or more signals received from one or more optical inspection tools. For example, as shown in FIG. 1, the classifier module 101B may include a classifier rules database 101C. The classifier rules database 101C may include properties (e.g. values of categorical attributes; value range specifications for directly calculate defect attribute or context attribute; linear combinations of direct and context attributes; nearest neighbor groupings of multiple attributes . . . ) defining various defect types for comparison with data generated by the scanning inspection tool 101A so as to enable the classifier module 101B to associate a particular optical signature with a defined defect type. The defect type definitions of the classifier rules database 101C may be generated from analysis of scanning inspection tool 101A data associated with known defects.

For example, one or more reference wafers having one or more defect types may be analyzed using a high-resolution inspection tool 103A (e.g. a technician may examine images of the reference wafer generated with a scanning electron microscope (SEM)) of the performance monitoring module 103 to determine the various defects present in the reference wafer. Upon analysis of the reference wafers using the high-resolution inspection tool 103A, a reference population distribution for the various defect types on each reference wafer may be determined. The reference population distribution may be provided to the classifier maintenance module 104.

An inspection of the one or more reference wafers may then be conducted by the inspection module 101 using a given set of defect type definitions stored in classifier rules database 101C. The inspection data generated by the scanning inspection tool 101A may be received by the classifier module 101B. The classifier module 101B may cross-reference the inspection data generated by the scanning inspection tool 101A with the defect type definitions maintained in the classifier rules database 101C in order to determine the presence of one or more defects as defined by those defect type definitions. The classifier module 101B may generate a resulting sample defect distribution corresponding to the respective populations of the defect types detected on the one or more reference wafers. The sample population distribution may be provided to the classifier maintenance module 104.

The reference population distribution received from performance monitoring module 103 and the sample population distribution received by the classifier maintenance module 104 may be compared to determine the correlation between the respective distributions.

Figure 14:
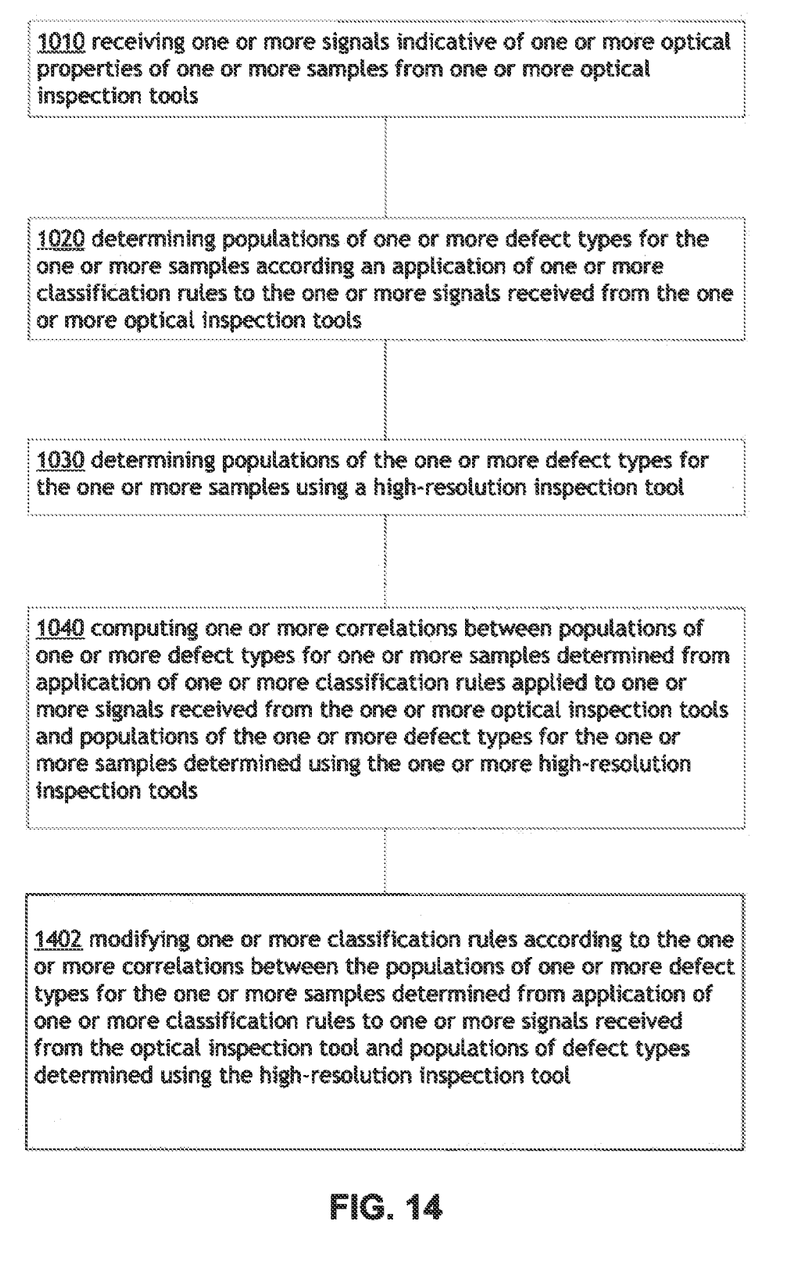
FIG. 14 shows a method for monitoring time-varying classification performance.

FIG. 14 illustrates alternative embodiments of the example operational flow 1000 of FIG. 10. FIG. 14 illustrates example embodiments where the operational flow 1000 may include at least one additional operation. Additional operations may include an operation 1402.

Operation 1402 depicts modifying one or more classification rules according to the one or more correlations between the populations of one or more defect types for the one or more samples determined from application of one or more classification rules to one or more signals received from the one or more scanning inspection tools and populations of defect types determined using the one or more high-resolution inspection tools. For example, as shown in FIG. 1, if it is determined by the defect analysis module 102 that current defect type definitions maintained by the classifier rules database 101C result in defect population data 108A generated by the inspection module 101 exhibiting at least one of instability or degraded performance as compared to defect population data 108B generated by the performance monitoring module 103, the classifier maintenance module 104 may modify those defect type definitions to decrease the instability or degraded performance. For example, the classifier maintenance module 104 may include a user interface 104A (e.g. a display, keyboard, touch screen, etc.) which may allow a user to modify the classifer properties maintained in the classifier rules database 101C. Either expert users or sophisticated rule based approaches with semi or fully automated perturbation functions can be applied to adjust a classifier to an acceptable level of stability and performance as measured on modified historical data.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link (e.g., transmitter, receiver, transmission logic, reception logic, etc.), etc.).

In a general sense, those skilled in the art will recognize that the various aspects described herein which can be implemented, individually and/or collectively, by a wide range of hardware, software, firmware, or any combination thereof can be viewed as being composed of various types of "electrical circuitry." Consequently, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), and/or electrical circuitry forming a communications device (e.g., a modem, communications switch, or optical-electrical equipment). Those having skill in the art will recognize that the subject matter described herein may be implemented in an analog or digital fashion or some combination thereof.

The herein described subject matter sometimes illustrates different components contained within, or connected with, different other components. It is to be understood that such depicted architectures are merely exemplary, and that in fact many other architectures may be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components, and/or wirelessly interactable, and/or wirelessly interacting components, and/or logically interacting, and/or logically interactable components.

In some instances, one or more components may be referred to herein as "configured to," "configurable to," "operable/operative to," "adapted/adaptable," "able to," "conformable/conformed to," etc. Those skilled in the art will recognize that "configured to" can generally encompass active-state components and/or inactive-state components and/or standby-state components, unless context requires otherwise.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to claims containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that typically a disjunctive word and/or phrase presenting two or more alternative terms, whether in the description, claims, or drawings, should be understood to contemplate the possibilities of including one of the terms, either of the terms, or both terms. For example, the phrase "A or B" will be typically understood to include the possibilities of "A" or "B" or "A and B."

With respect to the appended claims, those skilled in the art will appreciate that recited operations therein may generally be performed in any order. Also, although various operational flows are presented in a sequence(s), it should be understood that the various operations may be performed in other orders than those which are illustrated, or may be performed concurrently. Examples of such alternate orderings may include overlapping, interleaved, interrupted, reordered, incremental, preparatory, supplemental, simultaneous, reverse, or other variant orderings, unless context dictates otherwise. With respect to context, even terms like "responsive to," "related to," or other past-tense adjectives are generally not intended to exclude such variants, unless context dictates otherwise.

Although specific dependencies have been identified in the claims, it is to be noted that all possible combinations of the features of the claims are envisaged in the present application, and therefore the claims are to be interpreted to include all possible multiple dependencies. It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

What is claimed is:

1. A method for monitoring time-varying defect classification performance comprising:
    receiving one or more signals indicative of one or more properties of at least a first sample and a second sample from one or more scanning inspection tools;
    determining populations of one or more defect types for at least the first sample and the second sample according to an application of one or more classification rules to the one or more signals received from the one or more scanning inspection tools;
    determining populations of the one or more defect types for at least the first sample and the second sample using one or more high-resolution inspection tools; and
    computing a relative stability between populations of one or more defect types for at least the first sample and the second sample determined from application of one or more classification rules applied to one or more signals received from the one or more scanning inspection tools and populations of the one or more defect types for at least the first sample and the second sample determined using the one or more high-resolution inspection tools with a computing device.

2. The method of claim 1, wherein the one or more scanning inspection tools are selected from at least one of: a bright field patterned wafer inspector; a patterned dark field photon optics wafer inspector; an unpatterned dark field photon optics wafer inspector; and an electron beam optics area scanning inspector.

3. The method of claim 1, wherein the classification properties are selected from at least one of: size, shape, polarity, texture, contrast, background business.

4. The method of claim 1, wherein the one or more high-resolution inspection tools are selected from at least one of: a scanning electron microscope; an atomic force microscope; a confocal microscope.

5. The method of claim 1,
    wherein the determining populations of one or more defect types for at least the first sample and the second sample according to an application of one or more classification rules to the one or more signals received from the one or more scanning inspection tools comprises:
        determining a population of at least a first defect type and a second defect type for a sample according to an application of one or more classification rules to the one or more signals received from the one or more scanning inspection tools; and
    wherein the determining populations of the one or more defect types for at least the first sample and the second sample using one or more high-resolution inspection tools comprises:
        determining a population of at least a first defect type and a second defect type for a sample using the one or more high-resolution inspection tools; and
    wherein computing a relative stability between populations of one or more defect types for at least the first sample and the second sample determined from application of one or more classification rules applied to one or more signals received from the one or more scanning inspection tools and populations of the one or more defect types for at least the first sample and the second sample determined using the one or more high-resolution inspection tools comprises:

computing a first correlation between the population of the first defect type and the population of the second defect type as determined from application of one or more classification rules to one or more signals associated with the sample received from the one or more scanning inspection tools; and computing a second correlation between the population of the first defect type and the population of the second defect type as determined using the one or more high-resolution inspection tools; and computing a correlation between the first correlation and the second correlation.

6. The method of claim 1, further comprising:
generating one or more classification rules to be applied to one or more signals received from one or more scanning inspection tools.

7. The method of claim 1, further comprising:
modifying one or more classification rules according to the one or more correlations between the populations of one or more defect types for the one or more samples determined from application of one or more classification rules to one or more signals received from the one or more scanning inspection tools and populations of defect types determined using the one or more high-resolution inspection tools.

8. A system for monitoring time-varying defect classification performance comprising:
means for
receiving one or more signals indicative of one or more properties of at least a first sample and a second sample from one or more scanning inspection tools;
means for determining populations of one or more defect types for at least the first sample and the second sample according to an application of one or more classification rules to the one or more signals received from the one or more scanning inspection tools;
means for determining populations of the one or more defect types for at least the first sample and the second sample using one or more high-resolution inspection tools; and
means for computing a relative stability between populations of one or more defect types for at least the first sample and the second sample determined from application of one or more classification rules applied to one or more signals received from the one or more scanning inspection tools and populations of the one or more defect types for at least the first sample and the second sample determined using the one or more high-resolution inspection tools.

9. The system of claim 8, wherein the classification properties are selected from at least one of: size, shape, polarity, texture, contrast, background business.

10. The system of claim 8,
wherein the means for determining populations of one or more defect types for at least the first sample and the second sample according to an application of one or more classification rules to the one or more signals received from the one or more scanning inspection tools comprises:
means for determining a population of at least a first defect type and a second defect type for a sample according using the one or more high-resolution inspection tools; and
wherein the means for determining populations of the one or more defect types for at least the first sample and the second sample using one or more high-resolution inspection tools comprises:
determining a population of at least a first defect type and a second defect type for a sample according using the one or more high-resolution inspection tools; and
wherein the means for computing a relative stability between populations of one or more defect types for at least the first sample and the second sample determined from application of one or more classification rules applied to one or more signals received from the one or more scanning inspection tools and populations of the one or more defect types for at least the first sample and the second sample determined using the one or more high-resolution inspection tools comprises:
means for computing a first correlation between the population of the first defect type and the population of the second defect type as determined from application of one or more classification rules to one or more signals associated with the sample received from the one or more scanning inspection tools; and
means for computing a second correlation between the population of the first defect type and the population of the second defect type as determined using the one or more high-resolution inspection tools; and
means for computing a correlation between the first correlation and the second correlation.

11. The system of claim 8, further comprising:
means for generating one or more classification rules to be applied to one or more signals received from one or more scanning inspection tools.

12. The system of claim 8, further comprising:
means for modifying one or more classification rules according to the one or more correlations between the populations of one or more defect types for the one or more samples determined from application of one or more classification rules to one or more signals received from the one or more scanning inspection tools and populations of defect types determined using the one or more high-resolution inspection tools.

13. A non-transitory computer-readable medium including computer-readable instructions for execution of a process on a computing device, the process comprising:
receiving one or more signals indicative of one or more properties of at least a first sample and a second sample from one or more scanning inspection tools;
determining populations of one or more defect types for at least the first sample and the second sample according to an application of one or more classification rules to the one or more signals received from the one or more scanning inspection tools;
determining populations of the one or more defect types for at least the first sample and the second sample using one or more high-resolution inspection tools; and
computing a relative stability between populations of one or more defect types for at least the first sample and the second sample determined from application of one or more classification rules applied to one or more signals received from the one or more scanning inspection tools and populations of the one or more defect types for at least the first sample and the second sample determined using the one or more high-resolution inspection tools.

14. The computer-readable medium of claim 13, wherein the determining populations of one or more defect types for at least the first sample and the second sample according to an application of one or more classification rules to the one or more signals received from the one or more scanning inspection tools comprises:
determining populations of one or more defect types for at least a first sample and a second sample according an application of one or more classification rules to the one or more signals received from the one or more scanning inspection tools;

wherein the determining populations of the one or more defect types for at least the first sample and the second sample using one or more high-resolution inspection tools comprises:

determining populations of one or more defect types for at least the first sample and the second sample using the one or more high-resolution inspection tools; and wherein the computing a relative stability between populations of one or more defect types for at least the first sample and the second sample determined from application of one or more classification rules applied to one or more signals received from the one or more scanning inspection tools and populations of the one or more defect types for at least the first sample and the second sample determined using the one or more high-resolution inspection tools comprises:

computing a relative stability between at least the first sample and the second sample of populations of one or more defect types determined from application of one or more classification rules to one or more signals received from the one or more scanning inspection tools and populations of one or more defect types as determined through use of the one or more high-resolution inspection tools.

15. The computer-readable medium of claim 13, wherein the determining populations of one or more defect types for at least the first sample and the second sample according to an application of one or more classification rules to the one or more signals received from the one or more scanning inspection tools comprises:

determining a population of at least a first defect type and a second defect type for a sample using the one or more high-resolution inspection tools; and wherein the determining populations of the one or more defect types for at least the first sample and the second sample using one or more high-resolution inspection tools comprises:

determining a population of at least a first defect type and a second defect type for a sample using the one or more high-resolution inspection tools; and wherein the computing a relative stability between populations of one or more defect types for at least the first sample and the second sample determined from application of one or more classification rules applied to one or more signals received from the one or more scanning inspection tools and populations of the one or more defect types for at least the first sample and the second sample determined using the one or more high-resolution inspection tools comprises:

computing a first correlation between the population of the first defect type and the population of the second defect type as determined from application of one or more classification rules to one or more signals associated with the sample received from the one or more scanning inspection tools; and computing a second correlation between the population of the first defect type and the population of the second defect type as determined using the one or more high-resolution inspection tools; and computing a correlation between the first correlation and the second correlation.

16. The computer-readable medium of claim 13, further comprising:

generating one or more classification rules to be applied to one or more signals received from one or more scanning inspection tools.

17. The computer-readable medium of claim 13, further comprising:

modifying one or more classification rules according to the one or more correlations between the populations of one or more defect types for the one or more samples determined from application of one or more classification rules to one or more signals received from the one or more scanning inspection tools and populations of defect types determined using the one or more high-resolution inspection tools.

* * * * *